(12) United States Patent
Lee et al.

(10) Patent No.: US 10,770,150 B2
(45) Date of Patent: Sep. 8, 2020

(54) NON-VOLATILE MEMORY DEVICE AND INITIALIZATION INFORMATION READING METHOD THEREOF

(71) Applicant: SAMSUNG ELECTRONICS CO., LTD., Suwon-si, Gyeonggi-Do (KR)

(72) Inventors: Youn-Yeol Lee, Seoul (KR); Wook-Ghee Hahn, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/181,176

(22) Filed: Nov. 5, 2018

(65) Prior Publication Data
US 2019/0318787 A1    Oct. 17, 2019

(30) Foreign Application Priority Data

Apr. 12, 2018  (KR) .................. 10-2018-0042921

(51) Int. Cl.
| | |
|---|---|
| *G11C 16/26* | (2006.01) |
| *G11C 16/22* | (2006.01) |
| *G11C 16/30* | (2006.01) |
| *G11C 16/04* | (2006.01) |

(52) U.S. Cl.
CPC .............. *G11C 16/26* (2013.01); *G11C 16/22* (2013.01); *G11C 16/30* (2013.01); *G11C 16/0483* (2013.01)

(58) Field of Classification Search
CPC ......... G11C 16/26; G11C 16/22; G11C 16/30; G11C 16/0483
USPC ................................................... 365/185.18
See application file for complete search history.

(56) References Cited

U.S. PATENT DOCUMENTS

| | | | |
|---|---|---|---|
| 7,274,248 B2 | 9/2007 | Okamoto | |
| 8,867,278 B2 | 10/2014 | Kang et al. | |
| 8,947,947 B2 * | 2/2015 | Jeong | G11C 17/16 365/185.18 |
| 8,982,626 B2 | 3/2015 | Dong et al. | |
| 9,286,981 B2 | 3/2016 | Lim | |

(Continued)

FOREIGN PATENT DOCUMENTS

| | | |
|---|---|---|
| GB | 2 431 025 A | 4/2007 |
| KR | 101391358 A | 5/2014 |

OTHER PUBLICATIONS

European Office Action dated Jul. 24, 2019 Corresponding to Application No. EP 18215547.3.

*Primary Examiner* — Fernando Hidalgo
(74) *Attorney, Agent, or Firm* — Volentine, Whitt & Francos, PLLC

(57) ABSTRACT

In a method of reading initialization information from a non-volatile memory device, when power-up is detected, the non-volatile memory device divides a source voltage to generate a low read pass voltage which is to be provided to unselected word lines in an initialization information read operation. The low read pass voltage is set as at least one voltage between a ground voltage and the source voltage. The non-volatile memory device allows the source voltage not to be pumped in the initialization information read operation, based on the power-up. In the initialization information read operation, the non-volatile memory device provides the low read pass voltage to the unselected word lines and provides a read voltage to a selected word line to read initialization information stored in the memory cells.

18 Claims, 12 Drawing Sheets

(56) References Cited

U.S. PATENT DOCUMENTS

| | | | |
|---|---|---|---|
| 9,330,774 | B2 | 5/2016 | Kaneko et al. |
| 9,755,503 | B2 | 9/2017 | Kim et al. |
| 10,235,258 | B2* | 3/2019 | Son .................... G06F 11/2094 |
| 2003/0147287 | A1* | 8/2003 | Lee .......................... G11C 7/20 |
| | | | 365/189.09 |
| 2004/0213038 | A1* | 10/2004 | Maruyama .............. G11C 11/22 |
| | | | 365/158 |
| 2010/0091551 | A1* | 4/2010 | Hosono .............. G11C 13/0004 |
| | | | 365/148 |
| 2012/0250412 | A1 | 10/2012 | Lee |
| 2015/0221375 | A1* | 8/2015 | Choi ...................... G11C 16/10 |
| | | | 365/185.22 |
| 2016/0294193 | A1 | 10/2016 | Yuk |
| 2017/0148517 | A1* | 5/2017 | Harari ............... H01L 21/02532 |
| 2019/0051371 | A1* | 2/2019 | Kim .................. G11C 29/12015 |
| 2019/0244662 | A1* | 8/2019 | Lee .................... H01L 27/1157 |
| 2019/0267082 | A1* | 8/2019 | Parkinson ........... G11C 11/1693 |

* cited by examiner

Initialization Information Read Operation

|  | FIG. 5 | FIG. 6 |
|---|---|---|
| Unselected WLs | Vread_H | Vread_L |
| Selected WL | Vrd | Vrd |

NON-VOLATILE MEMORY DEVICE AND INITIALIZATION INFORMATION READING METHOD THEREOF

CROSS-REFERENCE TO RELATED APPLICATION

This application claims the benefit of Korean Patent Application No. 10-2018-0042921, filed on Apr. 12, 2018, in the Korean Intellectual Property Office, the disclosure of which is incorporated herein in its entirety by reference.

BACKGROUND

The inventive concept relates to a non-volatile memory device, and more particularly, to a non-volatile memory device, a voltage generation method, a read method, and a memory system and an electronic device each including the non-volatile memory device, which may reduce a consumption current while an initialization information read operation for the non-volatile memory device is being performed.

Solid state drives (SSDs) are high-performance and high-speed storage devices which store data in non-volatile memory devices. Non-volatile memory express (NVMe), which is an ultrahigh-speed data transmission standard optimized for accessing SSDs, is being applied to SSDs. NVMe provides direct input/output (I/O) access to storage devices (or non-volatile memory devices) equipped in peripheral component interconnect express (PCIe) interfaces.

The amount of content applied to a storage system including a storage device and a host is increasing. Therefore, the requirements for mass storage devices are increasing continuously. NVMe SSDs are mass storage devices each including a plurality of non-volatile memory devices each in turn including flash memory cells. NVMe-over fabrics (NVMe-oF) is an NVMe SSD-based storage array and may expand to fabrics capable of performing communication in a large scale parallel manner.

In non-volatile memory devices, initialization information including product content may be stored in NAND flash memory cells and may be read in a booting operation of applying power to the device. When the number of non-volatile memory devices included in NVMe SSDs or NVMe-oF increases considerably, the number of non-volatile memory devices required to read initialization information increases, and due to this, a consumption current and a consumption current peak based on an initialization information read operation increase.

SUMMARY

The inventive concept provides a non-volatile memory device, a voltage generation method, a read method, and a memory system and an electronic device each including the non-volatile memory device, which may reduce a consumption current while an initialization information read operation is being performed.

According to an aspect of the inventive concept, there is provided a non-volatile memory device including: a memory cell array configured to store initialization information for the non-volatile memory device in memory cells connected to a plurality of word lines; a control circuit configured to control application of a first read voltage to a selected word line and to control application of a second read voltage to unselected word lines in an initialization information read operation of reading the initialization information; and a voltage generator configured to decrease a source voltage to generate the second read voltage in response to a voltage control signal provided from the control circuit in the initialization information read operation.

According to another aspect of the inventive concept, there is provided a memory system including at least one non-volatile memory device and a memory controller configured to control the at least one non-volatile memory device, wherein the at least one non-volatile memory device includes: a memory cell array configured to store initialization information for the non-volatile memory device in memory cells connected to a plurality of word lines; a control circuit configured to control application of a first read voltage to a selected word line and to control application of a second read voltage to unselected word lines in an initialization information read operation of reading the initialization information; and a voltage generator configured to decrease a source voltage to generate the second read voltage in response to a voltage control signal provided from the control circuit in the initialization information read operation.

According to yet another aspect of the inventive concept, there is provided a read method of a non-volatile memory device, the read method including: detecting power-up; in response to the detected power-up, reading initialization information for the non-volatile memory device stored in memory cells of the non-volatile memory device; and when reading the initialization information, generating a first read voltage which is to be provided to a selected word line of a plurality of word lines connected to the memory cells, and generating a second read voltage which is to be provided to unselected word lines of the plurality of word lines connected to the memory cells, wherein the second read voltage is generated by decreasing a source voltage.

According to yet another aspect of the inventive concept, there is provided a method including: a non-volatile memory device detecting a power-up state for the memory device; and in response to detecting the power up state, the non-volatile memory device reading initialization information for the non-volatile memory device which is stored in first memory cells of a memory cell array of the non-volatile memory device and setting the initialization information for the non-volatile memory device in a set register of the non-volatile memory device. Reading the initialization information for the non-volatile memory device which is stored in first memory cells of a memory cell array of the non-volatile memory device comprises: applying to selected word lines connected to the first memory cells a first read voltage having a voltage level for discriminating between erase states and program states of the first memory cells; and while applying the first read voltage to the selected word lines, applying to unselected word lines which are not connected to the first memory cells a second read voltage which is less than voltage levels of the programs states of the first memory cells.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Figure 1:
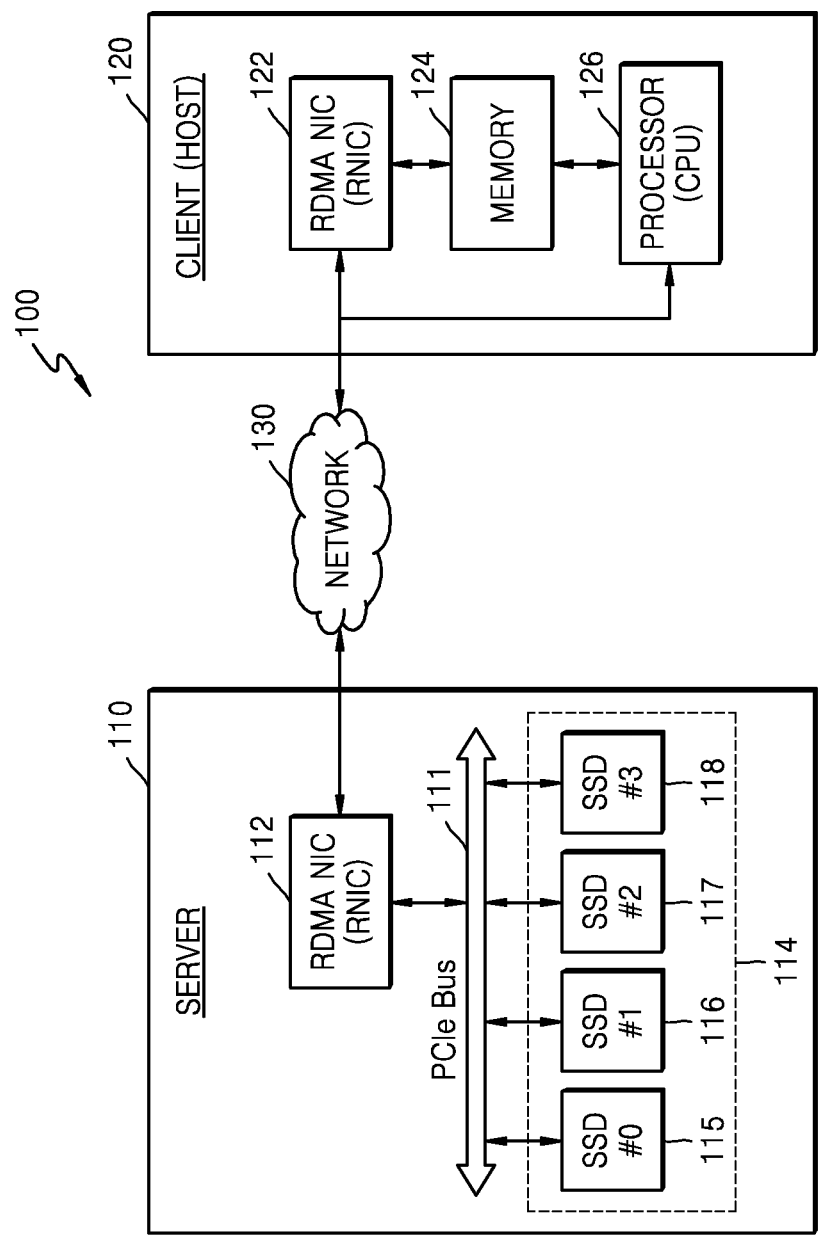
FIG. 1 illustrates a conceptual embodiment of a data processing system as an electronic device to which an embodiment of a non-volatile memory device is applied.

FIG. 1 illustrates a conceptual embodiment of a data processing system 100 as an electronic device to which an embodiment of a non-volatile memory device is applied.

Referring to FIG. 1, data processing system 100 may include a plurality of peers 110 and 120, which communicate with each other by using a remote direct memory access (RDMA) protocol. Peers 110 and 120 may each be a storage system or a computer system, which transmits or receives data over a network 130. Peers 110 and 120 may be provided as, and remote direct memory access (RDMA) connections may be provided between, for example, clients, servers, server palms, server clusters, application servers, or message servers.

Peers 110 and 120 are illustrated as a server 110 and a client 120. Server 110 may denote a peer which receives a request of client 120 over network 130, performs a service, and transmits a result of the service to client 120. Client 120 may denote a peer which issues a request to server 110 and waits for a response. Client 120 may be referred to as a host.

RDMA may perform data transmission from one memory to another device or a memory of a system. The data transmission may be to perform direct memory access (DMA) over network 130 without a central processing unit (CPU) (or a processor) or an operating system (OS), and enables a high throughput, low latency, and low overhead data transmission.

Network 130 is illustrated as an individual single network, but may be an arbitrary type of network as understood by one of ordinary skill in the art. Network 130 may be for personal use or common use, may be a wired network or a wireless network, or may be a whole network or a partial network. According to embodiments, network 130 may be a global network such as Internet or World Wide Web (referred to as Web), a wide area network (WAN), or a local area network (LAN).

Server 110 may include an RDMA network integrated circuit (RNIC) and a storage device 114, which are connected to a peripheral component interconnect express (PCIe) bus 111. PCIe is a high speed series computer extension bus standard which is designed for replacing PCI, PCI-X, and accelerated graphics port (AGP) bus standards. As compared to these other standards, PCIe may include improved performance-scaling and more detailed error detection and report mechanism for a higher maximum system bus throughput, a lower input/output (I/O) pin count, and a smaller physical throughput and bus devices.

RNIC 112 may be a network interface controller which supports a network interface card, a network adaptor, and/or RDMA. Storage device 114 connected to RNIC 112 may be implemented with a non-volatile memory express (NVMe) storage protocol using RDMA. The NVMe storage protocol may include, for example, one of an Internet wide area RDMA protocol (iWARP), an infiniband, and RDMA over converged Ethernet (RoCE).

Storage device 114 may include a plurality of storage elements 115 to 118, and storage elements 115 to 118 may be configured with NVMe solid state drives (NVMe SSDs) or PCIe SSDs. Storage device 114 may be implemented with NVMe-over fabrics (NVMe-oF). NVMe may be a scalable host controller interface which is designed to process the needs of a company, a data center, and a client system capable of using SSDs. NVMe may be used as an SSD device interface for proposing a storage entity interface to a host. NVMe may define a register interface optimized for NVMe SSDs, a command set, and a feature set, may use a functionality of NVMe SSDs, and may be located at a position for standardizing an NVMe SSD interface.

Client 120 may include an RNIC 122, a memory 124, and a processor (or a CPU) 126. Memory 124 may include a system memory, a main memory, a volatile memory, and a non-volatile memory. Memory 124 may be a volatile computer storage medium, a non-volatile computer storage medium, an attachable/detachable computer storage medium, or a non-detachable computer storage medium, which is implemented based on an arbitrary method or technology for storing a computer-readable command, a data structure, a program module, or other data. A computer storage medium may include random access memory (RAM), read-only memory (ROM), electrical erasable programmable read only memory (EEPROM), flash memory, or other memory technology, compact disk ROM (CD-ROM), digital versatile disk (DVD), or another optical storage, a magnetic cassette, a magnetic tape, a magnetic disk storage, or another magnetic storage, or another arbitrary medium, which is used to store desired information and is accessible by a computer system, but is not limited thereto.

Processor 126 may control an overall operation of data processing system 100. Processor 126 may include a plurality of processing cores, and the plurality of processing cores may each include a plurality of processing entries. Processor 126 may command a write or read operation of writing data in or reading from storage device 114 of server 110, based on a processing entry. For example, processor 126 may transmit a command to server 110 over network 130, where the command causes the server 110 to start data transmission, for example transmission of data stored in storage device 114.

RNIC 122 may be a network interface controller which supports a network interface card similar to RNIC 112 of server 110, a network adaptor, and/or RDMA. RNICs 112 and 122 may support an RDMA protocol. RNICs 112 and 122 may support the RDMA protocol which allows direct transmission of data from storage device 114 to memory 124 and/or from memory 124 to storage device 114. The data transmission may not need or include supervision by processor 126. Therefore, the RDMA protocol may have good characteristics such as high bandwidth, low latency, and low overhead.

In data processing system 100, storage elements (i.e., SSDs) 115 to 118 of server 110 may perform an initialization operation when power-up is detected in booting. An initialization operation of each of SSDs 115 to 118 may include an operation of reading initialization information stored in one or more non-volatile memory devices embedded into a corresponding SSD and setting the initialization information in a set register of the non-volatile memory device.

As SSDs increase in capacity, the number of non-volatile memory devices increases considerably, and thus, if non-volatile memory devices simultaneously perform an initialization information read operation, a consumption current of server 110 increases. Therefore, it is desired to develop a method of decreasing a consumption current based on an initialization information read operation of each of the non-volatile memory devices in an initialization operation of a mass SSD.

Figure 2:
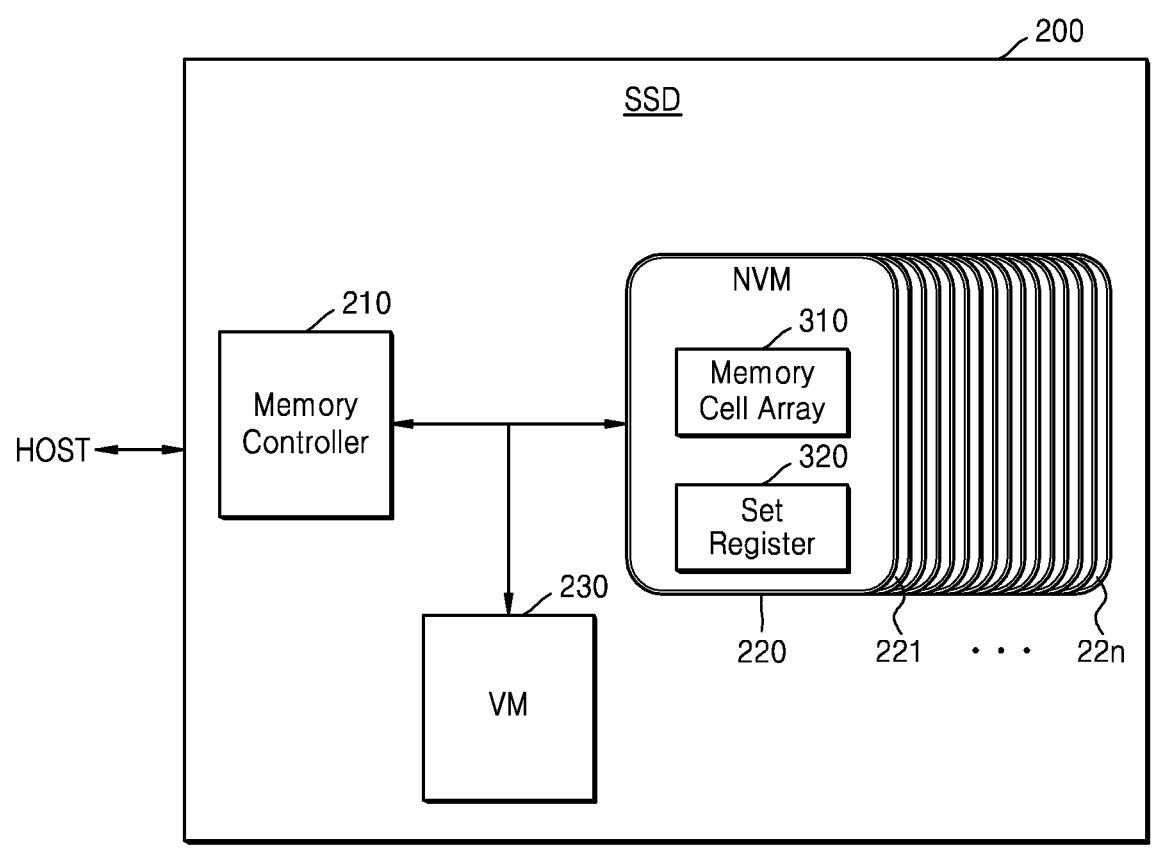
FIG. 2 is a block diagram illustrating a schematic configuration of a solid state driver (SSD) which is a memory system including an embodiment of a non-volatile memory device.

FIG. 2 is a block diagram illustrating a schematic configuration of an SSD 200 which is a memory system including an embodiment of a non-volatile memory device. SSD 200 of FIG. 2 may correspond to each of storage elements 115 to 118 of FIG. 1.

Referring to FIG. 2, SSD 200 may include a memory controller 210, a plurality of non-volatile memory devices 220 to 22$n$, and a volatile memory device 230. Memory controller 210 may control read operations, program operations, erase operations, and/or initialization information read operations of the plurality of non-volatile memory devices 220 to 22$n$, which may be in response to a request from a host connected to SSD 200. The host may correspond to client 120 of FIG. 1.

According to embodiments, the host may be an arbitrary computing system such as a personal computer (PC), a server computer, a workstation, a laptop computer, a mobile phone, a smartphone, a personal digital assistant (PDA), a portable multimedia player (PMP), a digital camera, a digital television (TV), a set-top box, a music player, a portable game console, a navigation system, or the like.

The plurality of non-volatile memory devices 220 to 22$n$ may each be used as a storage medium of SSD 200. Each of the plurality of non-volatile memory devices 220 to 22$n$ may be, for example, a NAND flash memory device. The plurality of non-volatile memory devices 220 to 22$n$ may be connected to memory controller 210 through a channel. In response to a request provided from the host through the channel, each of the plurality of non-volatile memory devices 220 to 22$n$ may perform a read operation, a program operation, and the erase operation, and in booting, may perform an initialization information read operation.

Volatile memory device 230 may temporarily store write data provided from the host or data read from each of the plurality of non-volatile memory devices 220 to 22$n$. Volatile memory device 230 may store metadata or cache data which is to be stored in the plurality of non-volatile memory devices 220 to 22$n$. Volatile memory device 230 may include dynamic RAM (DRAM), static random access memory (SRAM), and/or the like.

The plurality of non-volatile memory devices 220 to 22$n$ may each include a memory cell array 310 and a set register 320. Initialization information, which represents product content of a corresponding non-volatile memory device and is read through an initialization information read operation in booting, may be set in set register 320. Also, set register 320 may be store data and control signals, received from memory controller 210, for operation options, functions, characteristics, and operation modes of a corresponding non-volatile memory device.

Each of the plurality of non-volatile memory devices 220 to 22$n$ may store, as initialization information, protection information about the inhibition or permission of program/erase operations, trimming data for trimming an operating voltage level in an operation mode, column repair information for repairing a failed bit line, and bad block information including bad memory cells in a portion (see element 312 of FIG. 3) of memory cell array 310. The trimming data may be data for voltage control in operation modes (i.e., a read operation, a program operation, and an erase operation) of each of the plurality of non-volatile memory devices 220 to 22$n$, and moreover, may be data for controlling a sensing amplifier or a page buffer or setting initialization of a reference cell.

When power-up is detected in booting, SSD 200 may perform the initialization information read operation of each of the plurality of non-volatile memory devices 220 to 22$n$. In SSD 220 having a large capacity, when the number of non-volatile memory devices 220 to 22$n$ increases considerably, the plurality of non-volatile memory devices 220 to 22$n$ may simultaneously perform the initialization information read operation, and due to this, a consumption current peak occurs and the amount of consumption current may exceed an allowable value or limit. At least one reason for this is because a read pass voltage needed for the initialization information read operation is generated through a pumping operation simultaneously performed by non-volatile memory devices 220 to 22$n$. However, when the read pass voltage needed for the initialization information read operation is generated without the pumping operation in non-volatile memory devices 220 to 22$n$, the consumption current peak and the amount of consumption current may be reduced.

Hereinafter, an example configuration of non-volatile memory device 220 of non-volatile memory devices 220 to 22$n$ of FIG. 2 will be described in detail.

Figure 3:
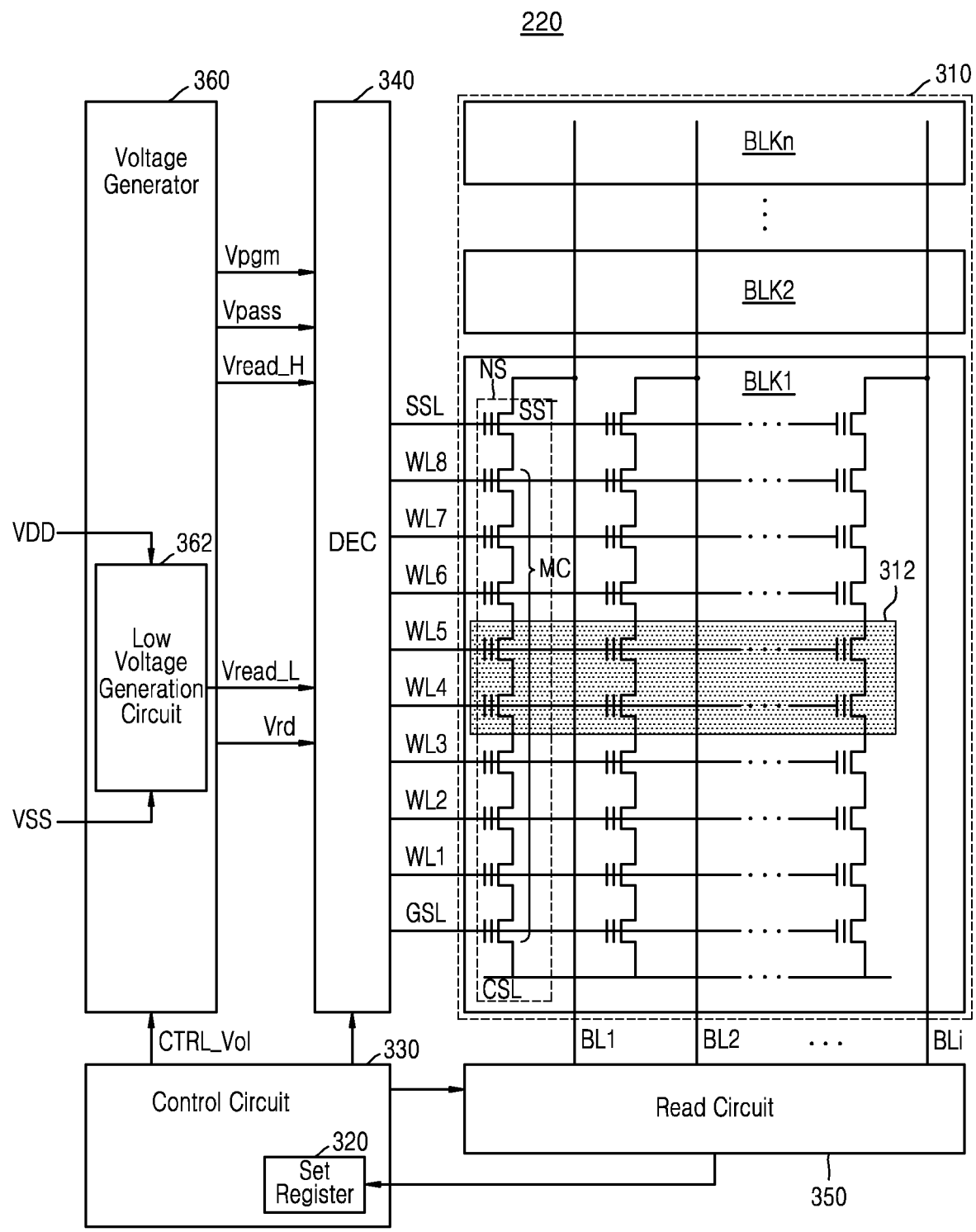
FIG. 3 is a block diagram for describing an embodiment of the non-volatile memory device illustrated in FIG. 2.

FIG. 3 is a block diagram for describing an example embodiment of non-volatile memory device 220 illustrated in FIG. 2.

Referring to FIG. 3, non-volatile memory device 220 may include a memory cell array 310, a control circuit 330, an address decoder 340, a read circuit 350, and a voltage generator 360. Although not shown, non-volatile memory device 220 may further include a write circuit and an I/O circuit. The write circuit may be configured with a write driver which receives data provided from memory controller 210 (see FIG. 2) to the I/O circuit through an I/O line and stores the received data in memory cell array 310. The I/O circuit may temporarily store a command, an address, a control signal, and data provided through the I/O line from memory controller 210. The I/O circuit may temporarily store read data of non-volatile memory device 220 and may output the read data to memory controller 210 through the I/O line at a predetermined time.

Memory cell array 310 may include a plurality of memory cells, and for example, the plurality of memory cells may be flash memory cells. Hereinafter, an example where the plurality of memory cells are NAND flash memory cells will be described as an example of embodiments. Memory cell array 310 may include a three-dimensional (3D) memory cell array including a plurality of NAND strings.

The 3D memory cell array may be a circuit that includes an active area disposed on a silicon substrate and is associated with an operation of each memory cell, and may be configured in a monolithic type on a physical level of at least one of memory cell arrays each including a circuit which is provided on or in the substrate. The monolithic type may denote that layers of levels configuring an array are stacked just on layers of lower levels of the array. In an embodiment, the 3D memory cell array may include a plurality of NAND strings which are arranged in a vertical direction in order for at least one memory cell to be disposed on another memory cell. The at least one memory cell may include a charge trap layer. U.S. Pat. Nos. 7,679,133, 8,553,466, 8,654,587 and 8,559,235 and U.S. Patent Application Publication No. 2011/0233648 disclose appropriate elements of a 3D memory array which includes a plurality of levels and in which word lines and/or bit lines are shared between the plurality of levels. These documents are incorporated herein by reference.

Memory cell array 310 may include a plurality of memory blocks (for example, first to nth memory blocks) BLK1 to BLKn. The plurality of memory blocks BLK1 to BLKn may be connected to string selection lines SSLs, word lines WLs, ground selection lines GSLs, and bit lines BLs. The plurality of memory blocks BLK1 to BLKn may be connected to address decoder 340 through the string selection lines SSLs, the word lines WLs, and the ground selection lines GSLs and may be connected to read circuit 350 through the bit lines BLs.

The first memory block BLK1 may include a plurality of NAND strings NSs, and the plurality of NAND strings NSs may each include a string selection transistor SST, a plurality of memory cells MCs, and a ground selection transistor GST, which are connected in series. The string selection transistor SST may be connected to a string selection line SSL, each of the plurality of memory cells MCs may be connected to corresponding word lines WL1 to WL8, and the ground selection transistor GST may be connected to a ground selection line GSL. The string selection transistor SST may be connected to corresponding bit lines BL1 to BLi, and the ground selection transistor GST may be connected to a common source line GSL.

The number of columns and rows of the NAND strings NSs of the first memory block BLK1 may increase or decrease. As the number of columns of the NAND strings NSs varies, the number of word lines WLs may vary. As the number of rows of the NAND strings NSs varies, the number of bit lines BLs connected to the columns of the NAND strings NSs and the number of NAND strings NSs connected to one string selection line SSL may vary. A height of each of the NAND strings NSs may increase or decrease. For example, the number of memory cells stacked in each of the NAND strings NSs may increase or decrease.

One-bit data may be stored in the memory cells of the first memory block BLK1. A memory cell for storing one-bit data in one memory cell may be referred to as a single level cell or a single bit cell.

The first memory block BLK1 may be set as a block which stores initialization information about non-volatile memory device 220. For example, it may be assumed that the initialization information about non-volatile memory device 220 is stored in a whole portion or a portion 312 of the first memory block BLK1. The memory cells in which the initialization information is stored may be referred to as "first memory cells" and the word lines which are connected to these first memory cells may be referred to as selected word lines, while the other word lines which are not connected to the first memory cells may be referred to as unselected word lines.

The second to nth memory blocks BLK2 to BLKn, like the first memory block BLK1, may each include a plurality of memory cells and a plurality of selection transistors. Each of the second to nth memory blocks BLK2 to BLKn may be set as a block which stores data transferred from memory controller 210. The memory cells of each of the second to nth memory blocks BLK2 to BLKn may be configured as multi-level cells (or multi-bit cells) for storing two or more-bit data in single level cells or one memory cell.

Control circuit 330 may control an overall operation of non-volatile memory device 220. Control circuit 330 may control a read operation, a program operation, and/or an erase operation on memory cell array 310, based on a command, an address, and control signals received from memory controller 210.

Control circuit 330 may provide a row address to address decoder 340, provide a column address to read circuit 350, and provide a voltage control signal CTRL_Vol to voltage generator 360. Control circuit 330 may detect power-up to generate the voltage control signal CTRL_Vol.

Control circuit 330 may control an operation of reading the initialization information stored in the first memory block BLK1 of memory cell array 310. Control circuit 330 may control a read pass voltage Vread level needed for performing an initialization information read operation. Control circuit 330 may perform control in order for the read pass voltage Vread level to be less than or equal to a source voltage VDD level in the initialization information read operation, based on the voltage control signal CTRL_Vol provided from voltage generator 360.

Control circuit 330 may include set register 320 which stores initialization information read through the initialization information read operation. It would be apparent to one of ordinary skill in the art that set register 320 may not be embedded into control circuit 330 in other embodiments.

Address decoder 340 may select one memory block from among the plurality of memory blocks BLK1 to BLKn of memory cell array 310 and may apply a word line voltage to each word line WL of the selected memory block. In a program operation, a program voltage Vpgm may be applied to the selected word line, and a pass voltage Vpass may be applied to an unselected word line. In a read operation, a read voltage Vrd may be provided to the selected word line, and a high read pass voltage Vread_H having a high voltage level which is greater than the source voltage VDD level may be provided to the unselected word line. In the initialization information read operation, the read voltage Vrd may be provided to the selected word line, and a low read pass voltage Vread_L generated by dividing the source voltage VDD may be provided to the unselected word line. In the present specification, the read voltage Vrd may be referred to as a first read voltage, and the read pass voltage Vread may be referred to as a second read voltage.

In the read operation, read circuit 350 may read data from each of the second to nth memory blocks BLK2 to BLKn of memory cell array 310 and may transfer the read data to a data I/O circuit which outputs the read data to memory controller 210. Also, in the initialization information read operation, read circuit 350 may read the initialization information stored in the first memory block BLK1 of memory cell array 310 and may set the read initialization information in set register 320 of control circuit 330. Read circuit 350 may include elements such as a page register or a page buffer, which performs reading of data, and a column selection circuit which selects the bit lines BLs.

In response to control by control circuit 330, voltage generator 360 may generate voltages (i.e., word line voltages) which are to be provided to the word lines WLs of memory cell array 310. In the program operation, voltage generator 360 may generate the program voltage Vpgm which is to be provided to a selected word line and the pass voltage Vpass which is to be provided to an unselected word line. In the read operation, voltage generator 360 may generate the read voltage Vrd which is to be provided to a selected word line and the high read pass voltage Vread_H which is to be provided to an unselected word line. Voltage generator 360 may pump the source voltage VDD to generate a high voltage and may generate the program voltage Vpgm, the pass voltage Vpass, and the high read pass voltage Vread_H from the generated high voltage. In some embodiments, voltage generator 360 may be provided with the source voltage VDD from memory controller 210. According to other embodiments, voltage generator 360 may be provided with the source voltage VDD without passing through memory controller 210.

Voltage generator 360 may include a low voltage generation circuit 362 which generates the low read pass voltage Vread_L to be provided to an unselected word line in the initialization information read operation, in response to the voltage control signal CTRL_Vol provided from control circuit 330. Low voltage generation circuit 362 may generate the low read pass voltage Vread_L to be provided to an unselected word line in the initialization information read operation, based on the source voltage VDD. Low voltage generation circuit 362 may generate the low read pass voltage Vread_L as a voltage generated by dividing the source voltage VDD (e.g., with a voltage divider such as a resistor divider or ladder). Embodiments of low voltage generation circuit 362 will be described below in detail with reference to FIGS. 7 to 12.

Figure 4:
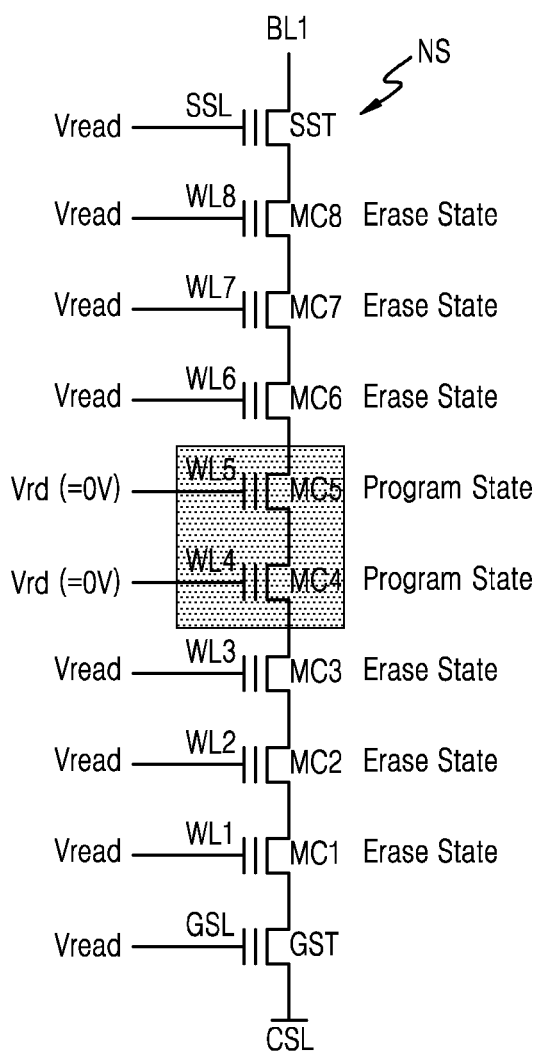
FIGS. 4 and 5 are diagrams for describing a first memory block of FIG. 3.
Figure 5:
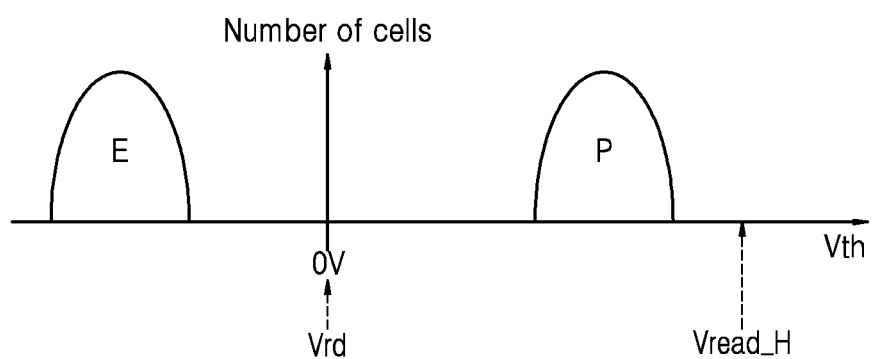

FIGS. 4 and 5 are diagrams for describing the first memory block BLK1 of FIG. 3. FIG. 4 is a circuit diagram of a NAND string NS storing initialization information in the first memory block BLK1. FIG. 5 is a graph showing a threshold voltage distribution of single level cells of the first memory block BLK1. In FIG. 5, the abscissa axis represents a threshold voltage Vth, and the ordinate axis represents the number of memory cells.

Referring to FIG. 4, a NAND string NS may include a string selection transistor SST, first to eighth memory cells MC1 to MC8, and a ground selection transistor GST. For example, initialization information may be stored in the fourth and fifth memory cells MC4 and MC5 of the first to eighth memory cells MC1 to MC8.

The first to eighth memory cells MC1 to MC8 may be in an erase state through a first-performed erase operation before the initialization information is stored in the fourth and fifth memory cells MC4 and MC5, namely, before the fourth and fifth memory cells MC4 and MC5 are programmed Subsequently, a program operation of storing the initialization information in the fourth and fifth memory cells MC4 and MC5 of the first to eighth memory cells MC1 to MC8 may be performed. Therefore, the fourth and fifth memory cells MC4 and MC5 may be in a program state, and the first to third memory cells MC1 to MC3 and the sixth to eighth memory cells MC6 to MC8 may be in the erase state.

In an initialization information read operation, in order to read the initialization information stored in the fourth and fifth memory cells MC4 and MC5, a read voltage Vrd may be applied to selected fourth and fifth word lines WL4 and WL5 according to a predetermined order, and a read pass voltage Vread may be applied to unselected first to third word lines WL1 to WL3 and sixth to eighth word lines WL6 to WL8. Also, a voltage (for example, the read pass voltage Vread) for turning on the string selection transistor SST and the ground selection transistor GST may be applied to a string selection line SSL and a ground selection line GSL.

For example, the read voltage Vrd may be a voltage for determining program states of the first to eighth memory cells MC1 to MC8 and may have a level between threshold voltage distributions based on the program states of the first to eighth memory cells MC1 to MC8.

In a general read method, the read pass voltage Vread may be a voltage for turning on each of the first to eighth memory cells MC1 to MC8 regardless of the program states of the first to eighth memory cells MC1 to MC8, and may be a high voltage.

The first to eighth memory cells MC1 to MC8 storing the initialization information may be single level cells, and thus, as shown in FIG. 5, may have one of an erase state E and a program state P. Therefore, a ground voltage (i.e., a voltage of 0 V) between a distribution based on the erase state E and a distribution based on the program state P may be set as the read voltage Vrd which is applied to the selected fourth and fifth word lines WL4 and WL5. A high read pass voltage Vread_H may be applied to the unselected first to third word lines WL1 to WL3 and sixth to eighth word lines WL6 to WL8, based the general read method. The high read pass voltage Vread_H may be a voltage which is greater than a threshold voltage distribution based on the program state P.

In this case, voltage generator 360 (see FIG. 3) may perform a pumping operation using a source voltage VDD to generate the high read pass voltage Vread_H. Therefore, non-volatile memory device 220 (see FIG. 3) may perform the pumping operation for generating the high read pass voltage Vread_H in the initialization information read operation, and thus, a consumption current may increase.

Figure 6:
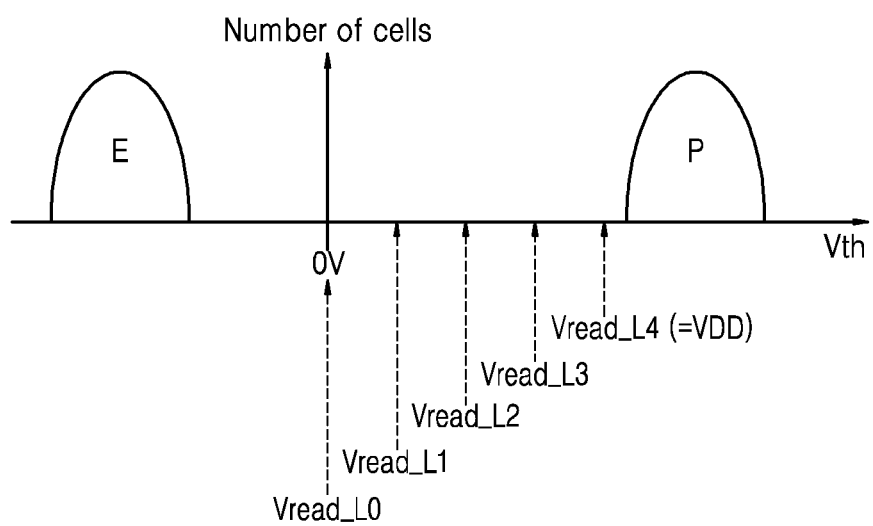
FIG. 6 is a diagram for conceptually describing an embodiment of an initialization information reading.

FIG. 6 is a diagram for conceptually describing an embodiment of an initialization information reading method.

Referring to FIGS. 4 and 6, when the memory cells of the first memory block BLK1 (see FIG. 3) storing the initialization information are single level cells, a distribution of memory cells with respect to a threshold voltage Vth is shown. In the NAND string NS of FIG. 4, the fourth and fifth memory cells MC1 and MC5 may be in a program state P, and the first to third memory cells MC1 to MC3 and the sixth to eighth memory cells MC6 to MC8 may be in an erase state E. The memory cells MC1 to MC3 and MC6 to MC8 having the erase state E may have a negative (−) threshold voltage Vth, and thus, as shown, even when one of the first to fifth read pass voltages Vread_L0 to Vread_L4 is applied to unselected word lines WL1 to WL3 and WL6 to WL8, the memory cells MC1 to MC3 and MC6 to MC8 may be turned on.

For example, the first read pass voltage Vread_L0 may be set to 0 V, namely, a ground voltage VSS level, and the fifth read pass voltage Vread_L4 may be set to a source voltage VDD level. The number of read pass voltages Vread_L0 to Vread_L4 between the ground voltage VSS and the source voltage VDD illustrated in FIG. 6 is five, but embodiments are not limited thereto. A low read pass voltage Vread_L in an initialization information read operation according to an embodiment may be set as at least one voltage between the low read pass voltage Vread_L and the ground voltage VSS.

The first to fifth read pass voltages Vread_L0 to Vread_L4 may be provided from low voltage generation circuit 362 which divides the source voltage VDD. A detailed configuration of low voltage generation circuit 362 will be described below with reference to FIGS. 7 to 12.

Figure 7:
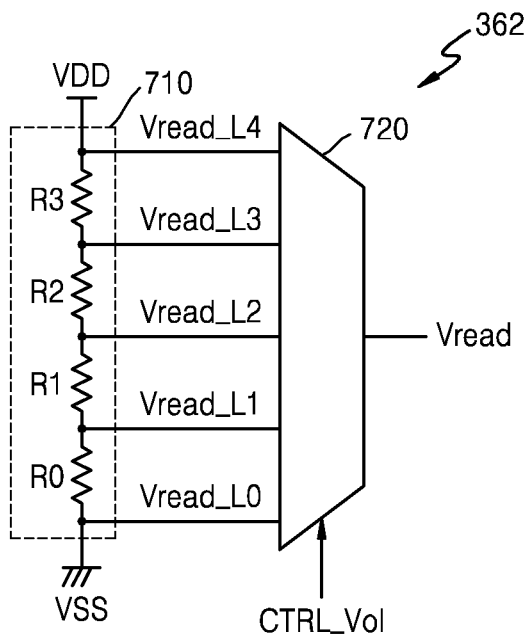
FIGS. 7, 8 and 9 are diagrams for describing an exemplary embodiment of the low voltage generation circuit of FIG. 3.
Figure 8:
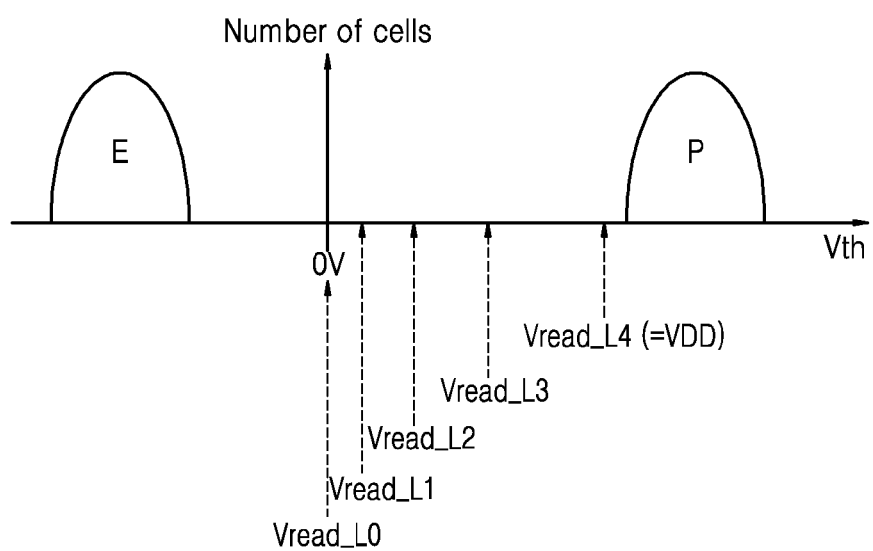
Figure 9:
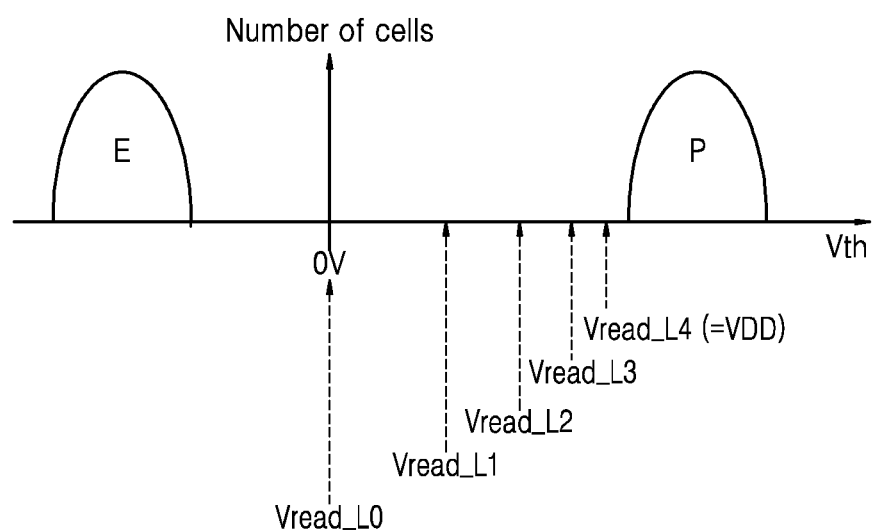

FIGS. 7 to 9 are diagrams for exemplarily describing an embodiment of low voltage generation circuit 362 of FIG. 3.

Referring to FIG. 7, low voltage generation circuit 362 may include a voltage divider 710 and a selector 720. Voltage divider 710 may include a plurality of resistors R0 to R3 which are serially connected between a source voltage VDD and a ground voltage VSS. Voltages of both ends of each of the plurality of resistors R0 to R3 may be output as first to fifth read pass voltages Vread_L0 to Vread_L4.

When the plurality of resistors R0 to R3 have the same resistance values, the first to fifth read pass voltages Vread_L0 to Vread_L4 may have an equal voltage difference as shown in FIG. 6. For example, when the plurality of resistors R0 to R3 have different resistance values, the first to fifth read pass voltages Vread_L0 to Vread_L4 may have different voltage differences as shown in FIG. 8 or FIG. 9.

In FIG. 8, when resistance values R0 to R3 of the plurality of resistors R0 to R3 have a relationship of R3>R2>R1>R0, the first to fifth read pass voltages Vread_L0 to Vread_L4 output from voltage divider 710 are shown.

In FIG. 9, when resistance values R0 to R3 of the plurality of resistors R0 to R3 have a relationship of R3<R2<R1<R0, the first to fifth read pass voltages Vread_L0 to Vread_L4 output from voltage divider 710 are shown.

In response to the voltage control signal CTRL_Vol provided from control circuit 330, selector 720 may select one read pass voltage from among the first to fifth read pass voltages Vread_L0 to Vread_L4 output from voltage divider 710 and may output the selected read pass voltage as a low read pass voltage Vread_L.

Therefore, in an initialization information read operation, in response to the voltage control signal CTRL_Vol, low voltage generation circuit 362 may generate, as the low read pass voltage Vread_L, one of the first to fifth read pass voltages Vread_L0 to Vread_L4 between the ground voltage VSS and the source voltage VDD.

Figure 10:
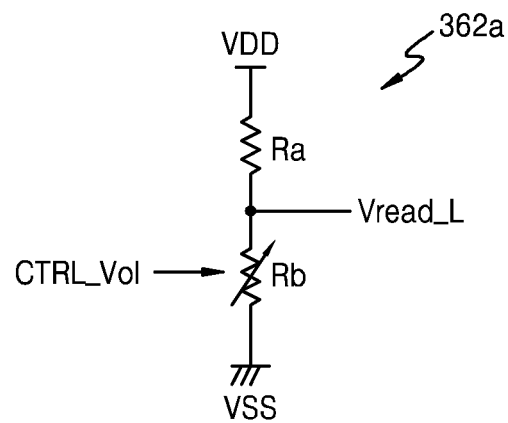
FIGS. 10, 11 and 12 are diagrams for describing other exemplary embodiments of the low voltage generation circuit of FIG. 3.
Figure 11:
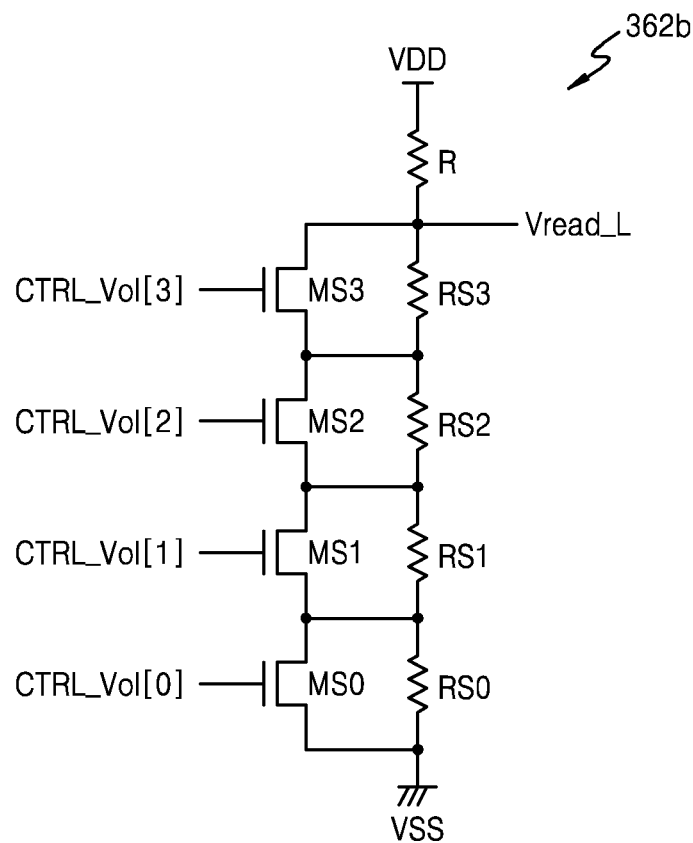
Figure 12:
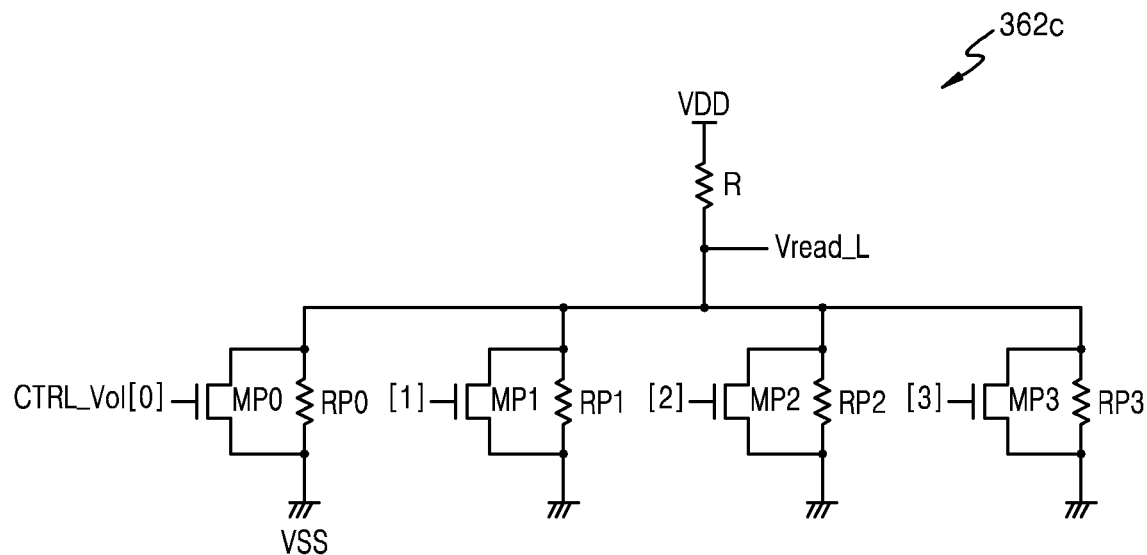

FIGS. 10 to 12 are diagrams for exemplarily describing other embodiments of low voltage generation circuit 362 of FIG. 3.

Referring to FIG. 10, a low voltage generation circuit 362a may include first and second resistors Ra and Rb, which are serially connected between a source voltage VDD and a ground voltage VSS and may output a low read pass voltage Vread_L to a connection node between the first and second resistors Ra and Rb. A resistance of the second resistor Rb may vary according to the voltage control signal CTRL_Vol provided from control circuit 330.

In an initialization information read operation, low voltage generation circuit 362a may generate the low read pass voltage Vread_L as a voltage generated from the source voltage VDD divided by the first and second resistors Ra and Rb.

Referring to FIG. 11, a low voltage generation circuit 362b may include a first resistor R and a plurality of resistors RS0 to RS3, which are serially connected between a source voltage VDD and a ground voltage VSS, and a plurality of transistors MS0 to MS3 connected between the plurality of resistors RS0 to RS3. A voltage corresponding to a voltage control signal code CTRL_Vol[0:3] provided as bit information from control circuit 330 may be applied to a gate of each of the transistors MS0 to MS3.

Low voltage generation circuit 362b may output a low read pass voltage Vread_L to a connection node between the first resistor R and the plurality of resistors RS0 to RS3. The first resistor R and the plurality of resistors RS0 to RS3 may have the same resistance values. According to an embodiment, the first resistor R and the plurality of resistors RS0 to RS3 may have different resistance values.

In an initialization information read operation, low voltage generation circuit 362b may generate the low read pass voltage Vread_L as a voltage generated from the source voltage VDD divided by the resistors RS0 to RS3 short-circuited based on the voltage control signal code CTRL_Vol[0:3].

Referring to FIG. 12, a low voltage generation circuit 362c may include a first resistor R, a plurality of resistors RP0 to RP3 connected in parallel between the first resistor R and a ground voltage VSS, and a plurality of transistors MP0 to MP3 connected between the plurality of resistors RP0 to RP3. A voltage corresponding to a voltage control signal code CTRL_Vol[0:3] provided from control circuit 330 may be applied to a gate of each of the transistors MP0 to MP3.

Low voltage generation circuit 362c may output a low read pass voltage Vread_L to a connection node between the first resistor R and the plurality of resistors RP0 to RP3. The first resistor R and the plurality of resistors RP0 to RP3 may have the same resistance values. According to an embodiment, the first resistor R and the plurality of resistors RP0 to RP3 may have different resistance values.

In an initialization information read operation, low voltage generation circuit 362c may generate the low read pass voltage Vread_L as a voltage generated from the source voltage VDD divided by the resistors RP0 to RP3 short-circuited based on the voltage control signal code CTRL_Vol[0:3].

Figures 13, 14:
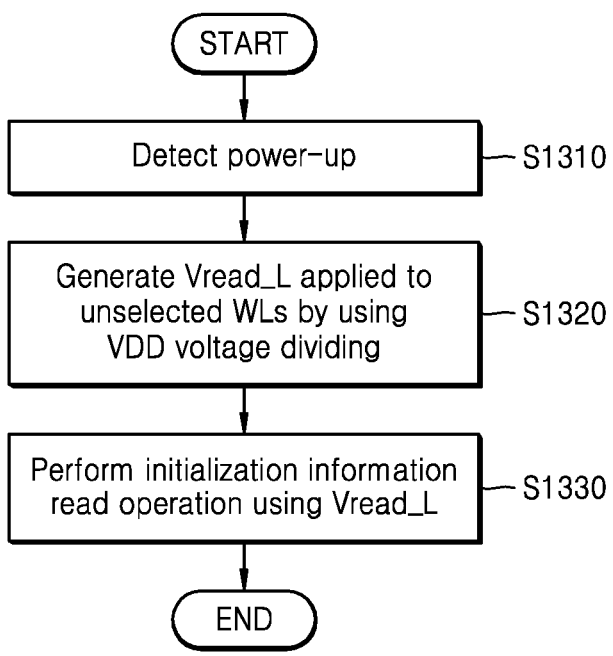
FIG. 13 is a flowchart illustrating an embodiment of an initialization information reading method of the non-volatile memory device illustrated in FIG. 3.
FIG. 14 is a table showing an example where word line voltages are applied based on an initialization information read operation of FIG. 13.

FIG. 13 is a flowchart illustrating an embodiment of an initialization information reading method of memory device 220 illustrated in FIG. 3.

Referring to FIG. 13, in operation S1310, a non-volatile memory device (220 of FIG. 3) may detect power-up. Non-volatile memory device 220 may generate a voltage control signal CTRL_Vol, based on the power-up.

In operation S1320, in response to the voltage control signal CTRL_Vol, the non-volatile memory device 220 may divide a source voltage VDD to generate a low read pass voltage Vread_L which is to be provided to unselected word lines in an initialization information read operation. The low read pass voltage Vread_L may be set as at least one voltage between a ground voltage VSS and the source voltage VDD. In response to the voltage control signal CTRL_Vol, non-volatile memory device 220 may allow the source voltage VDD not to be pumped during the initialization information read operation.

In operation S1330, non-volatile memory device 220 may provide the low read pass voltage Vread_L to the unselected word lines and may provide a read voltage Vrd to a selected word line to read initialization information stored in memory cells of a first memory block BLK1. Non-volatile memory device 220 may set the read initialization information in a set register.

FIG. 14 is a table showing an example where word line voltages are applied based on the initialization information read operation of FIG. 13. The table of FIG. 14 shows a result obtained by comparing an example initialization information read operation of a non-volatile memory device performed as described above with respect to FIG. 5 and an example initialization information read operation of a non-volatile memory device as described above with respect to FIG. 6.

Referring to the table of FIG. 14 along with FIG. 4, in a conventional initialization information reading method, the high read pass voltage Vread_H may be applied to the unselected first to third word lines WL1 to WL3 and sixth to eighth word lines WL6 to WL8. The high read pass voltage Vread_H may be a voltage generated by pumping the source voltage VDD. The read voltage Vrd may be applied to the selected fourth and fifth word lines WL4 and WL5 according to a predetermined order. The read voltage Vrd may be a voltage for determining program states of the first to eighth memory cells MC1 to MC8. The first to eighth memory cells MC1 to MC8 storing the initialization information may be single level cells, and thus, as shown in FIG. 5, may have one of the erase state E and the program state P. Therefore, a voltage of 0 V between a distribution based on the erase state E and a distribution based on the program state P may be set as the read voltage Vrd which is applied to the selected fourth and fifth word lines WL4 and WL5.

In contrast to the above example, in an initialization information reading method as disclosed herein, the low read pass voltage Vread_L may be applied to the unselected first to third word lines WL1 to WL3 and sixth to eighth word lines WL6 to WL8. The low read pass voltage Vread_L may be a voltage generated by dividing the source voltage VDD, and as shown in FIGS. 6, 9, and 10, may be set as one of the first to fifth read pass voltages Vread_L0 to Vread_L4.

Figure 15:
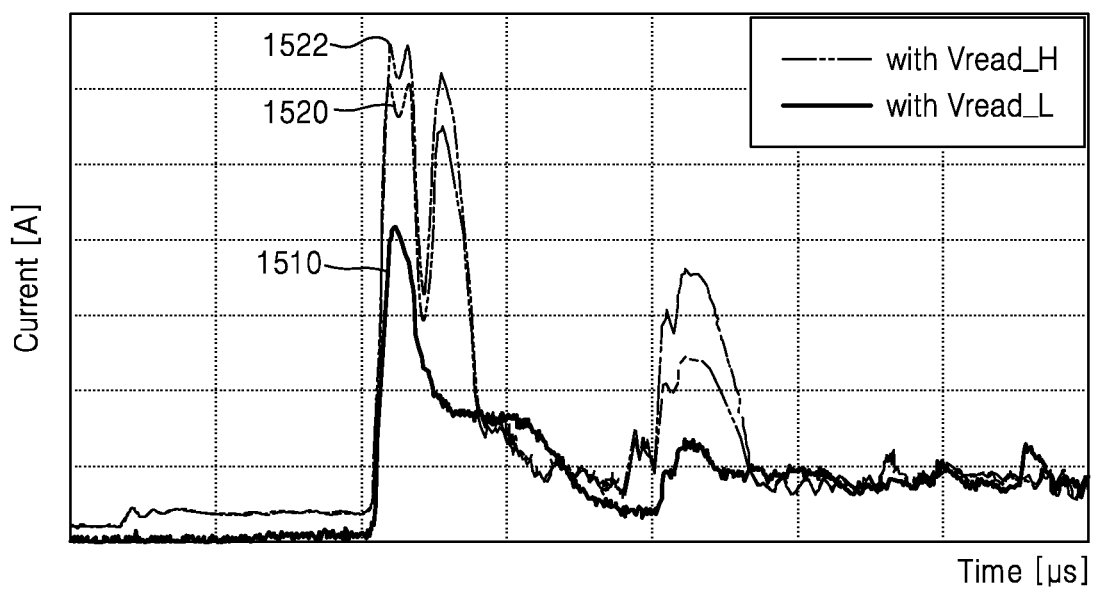
FIG. 15 is a diagram illustrating a consumption current pattern when an initialization information read operation is performed by using the embodiment of a non-volatile memory device illustrated in FIG. 3.

FIG. 15 is a diagram illustrating a consumption current pattern when an initialization information read operation is performed by using an embodiment of the non-volatile memory device illustrated in FIG. 3.

Referring to FIG. 15, in the initialization information read operation of non-volatile memory device 220 (see FIG. 3), a consumption current pattern 1510 when the low read pass voltage Vread_L applied to unselected word lines is applied as a voltage generated by dividing the source voltage VDD is shown. Also, a consumption current pattern 1520 when the high read pass voltage Vread_H generated by pumping the source voltage VDD is applied to the unselected word lines is shown. A consumption current peak 1522 caused by a pumping operation of generating the high read pass voltage Vread_H may be observed in consumption current pattern 1520.

In comparison with consumption current pattern 1520 when the high read pass voltage Vread_H is applied as a high pumping voltage, it may be seen that in consumption current pattern 1510 when the low read pass voltage Vread_L generated by dividing the source voltage VDD is applied to unselected word lines, a consumption current is considerably reduced. Also, since a high voltage pumping operation is not performed, a consumption current peak is not shown in consumption current pattern 1510.

Therefore, when an SSD uses non-volatile memory device 220 which applies the low read pass voltage Vread_L, generated by dividing the source voltage VDD, to unselected word lines in the initialization information read operation, a consumption current may be easily reduced. Also, in a mass SSD, a consumption current peak may not occur in the initialization information read operation despite an increase in number of non-volatile memory devices 220, and thus, the mass SSD may stably perform an initialization operation.

Figure 16:
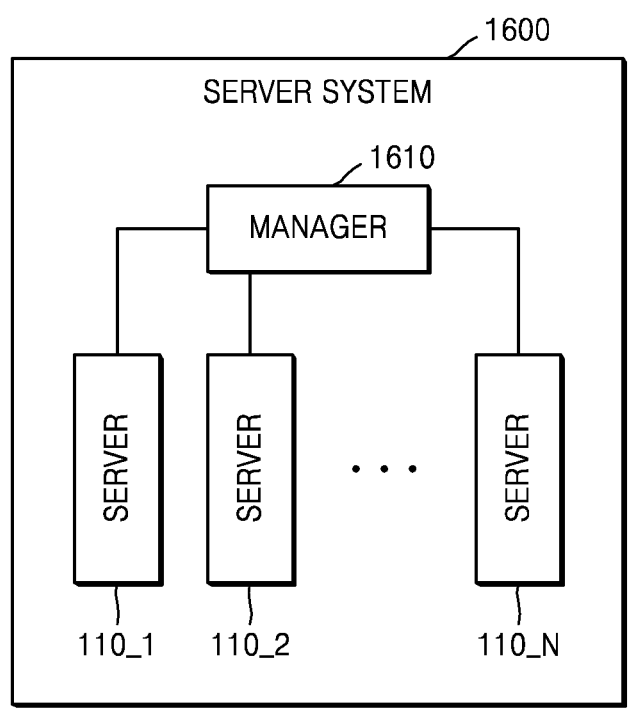
FIG. 16 is a block diagram illustrating a server system to which a storage device including embodiments of a non-volatile memory device is applied.

FIG. 16 is a block diagram illustrating a server system 1600 to which a storage device including embodiments of a non-volatile memory device are applied.

Referring to FIG. 16, server system 1600 may include a plurality of servers 110_1 to 110_N. The plurality of servers 110_1 to 110_N may be connected to a manager 1610. Each of the plurality of servers 110_1 to 110_N may be the same as or similar to server 110 described above with reference to FIG. 1.

The plurality of servers 110_1 to 110_N may each include a plurality of mass SSDs, and the mass SSDs may include a plurality of non-volatile memory devices. The non-volatile memory devices may store initialization information in memory cells of a first memory block including single level cells among a plurality of memory blocks and may store user data in the other memory blocks. When power-up is detected in booting, the non-volatile memory devices may divide a source voltage to generate a low read pass voltage which is to be provided to unselected word lines in an initialization information read operation. The low read pass voltage may be set as at least one voltage between a ground voltage and the source voltage. The non-volatile memory devices may allow the source voltage not to be pumped in the initialization information read operation, based on the power-up. In the initialization information read operation, the non-volatile memory devices may select the first memory block, provide the low read pass voltage to unselected word lines, and provide a read voltage to a selected word line, thereby reading the initialization information stored in the memory cells of the first memory block. The non-volatile memory devices may set the read initialization information in a set register.

Figure 17:
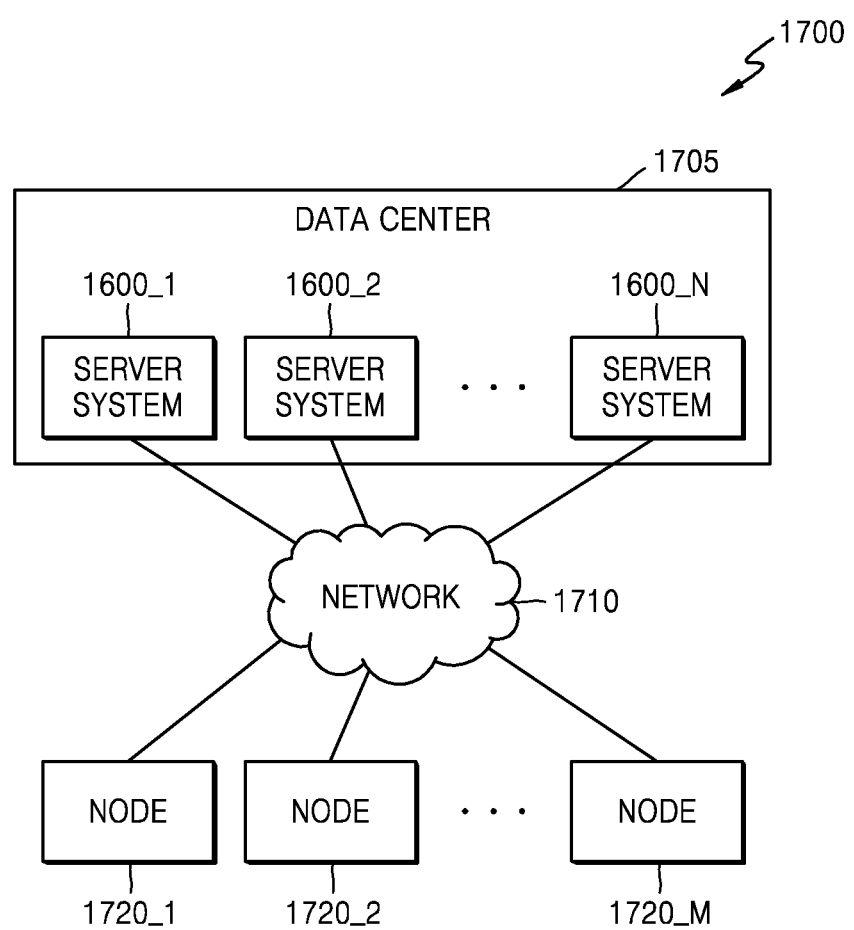
FIG. 17 is a block diagram illustrating a storage cluster to which a storage device including embodiments of a non-volatile memory device are applied.

FIG. 17 is a block diagram illustrating a storage cluster 1700 to which a storage device including embodiments of a non-volatile memory device is applied.

Referring to FIG. 17, in the big data and artificial intelligence (AI) age, storage cluster 1700 is attracting attention as a high performance computing infrastructure which quickly calculates massive data. Storage cluster 1700 may configure a parallel computing environment through mass clustering, thereby maximizing calculation performance. Storage cluster 1700 may provide a network-connected storage or a storage area network, based on the number of storage memories and the flexibility and reconfigurable disposition of a physical component.

Storage cluster 1700 may include a data center 1705 implemented with a plurality of server systems 1600_1 to 1600_N. Each of the plurality of server systems 1600_1 to 1600_N may be the same as or similar to server system 1600 illustrated in FIG. 16.

The plurality of server systems 1600_1 to 1600_N may communicate with various storage nodes 1720_1 to 1720_M over a network 1710 such as a computer network (for example, LAN or WAN) or the Internet. According to some embodiments, storage nodes 1720_1 to 1720_M may not be sequentially arranged or may not be adjacent to one another. For example, storage nodes 1720_1 to 1720_M may be ones of client computers, servers, remote data centers, and storage systems.

One server system receiving a request of each of storage nodes 1720_1 to 1720_M among the plurality of server systems 1600_1 to 1600_N may include a plurality of mass SSDs, and the mass SSDs may include a plurality of non-volatile memory devices. The non-volatile memory devices may store initialization information in memory cells of a first memory block including single level cells among a plurality of memory blocks and may store user data in the other memory blocks. When power-up is detected in booting, the non-volatile memory devices may divide a source voltage to generate a low read pass voltage which is to be provided to unselected word lines in an initialization information read operation. The low read pass voltage may be set as at least one voltage between a ground voltage and the source voltage. The non-volatile memory devices may allow the source voltage not to be pumped in the initialization information read operation, based on the power-up. In the initialization information read operation, the non-volatile memory devices may select the first memory block, provide the low read pass voltage to unselected word lines, and provide a read voltage to a selected word line, thereby reading the initialization information stored in the memory cells of the first memory block. The non-volatile memory devices may set the read initialization information in a set register.

Figure 18:
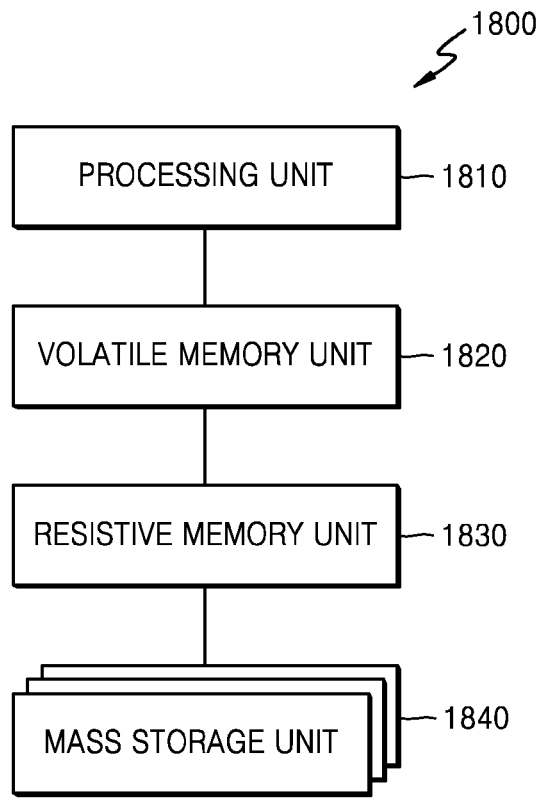
FIG. 18 is a block diagram illustrating a system including embodiments of a non-volatile memory device.

FIG. 18 is a block diagram illustrating a system 1800 including a non-volatile memory device according to embodiments.

Referring to FIG. 18, system 1800 may include a processing unit 1810, a volatile memory unit 1820, a resistive memory unit 1830, and a mass storage unit 1840. Also, system 1800 may be a mobile device, a PC, a server computer, a programmable home appliance, or a general-use or special-purpose computer system such as a main frame computer.

A functional unit described in the present embodiment may be classified as a module, for implementation independence. For example, the module may be implemented as a computing very large scale integration (VLSI) circuit or a hardware circuit including a semiconductor such as a gate array, a logic chip, a transistor, or a discrete component. The module may be implemented as a programmable hardware device, for example, a programmable gate array, a programmable gate logic, or a programmable gate device. Also, the module may be implemented as software including executable code, an object, a procedure, or a function.

Processing unit 1810 may execute an OS and a plurality of software systems and may perform calculations or tasks. Processing unit 1810 may be a microprocessor or a CPU.

Volatile memory unit 1820, a cache memory or a working memory of system 1800, may denote a medium which stores data temporarily or in the short term. Volatile memory unit 1820 may include one or more memory devices, and for example, may include DRAM.

Resistive memory unit 1830 may be used to act as a cache of mass storage unit 1840. Resistive memory unit 1830 may store a frequently accessed application or some data of an OS. Resistive memory unit 1830 may include one or more memory devices, and for example, may include DRAM.

Mass storage unit 1840 may be implemented as an SSD, a PCIe memory module, or NVMe. Optionally, one or more tiers of mass storage unit 1840 may be implemented with one or more network-accessible devices and/or services, for example, clients, servers, server palm(s), server cluster(s), application server(s), or message server(s), accessed based on NVMe-oF and/or RDMA. Mass storage unit 1840 may denote a storage medium which stores user data in the long term in system 1800. Mass storage unit 1840 may store an application program, program data, and/or the like.

Mass storage unit 1840 may include a plurality of mass SSDs, and the mass SSDs may include a plurality of non-volatile memory devices. The non-volatile memory devices may store initialization information in memory cells of a first memory block including single level cells among a plurality of memory blocks and may store user data in the other memory blocks. When power-up is detected in booting, the non-volatile memory devices may divide a source voltage to generate a low read pass voltage which is to be provided to unselected word lines in an initialization information read operation. The low read pass voltage may be set as at least one voltage between a ground voltage and the source voltage. The non-volatile memory devices may allow the source voltage not to be pumped in the initialization information read operation, based on the power-up. In the initialization information read operation, the non-volatile memory devices may select the first memory block, provide the low read pass voltage to unselected word lines, and provide a read voltage to a selected word line, thereby reading the initialization information stored in the memory cells of the first memory block. The non-volatile memory devices may set the read initialization information in a set register.

Figure 19:
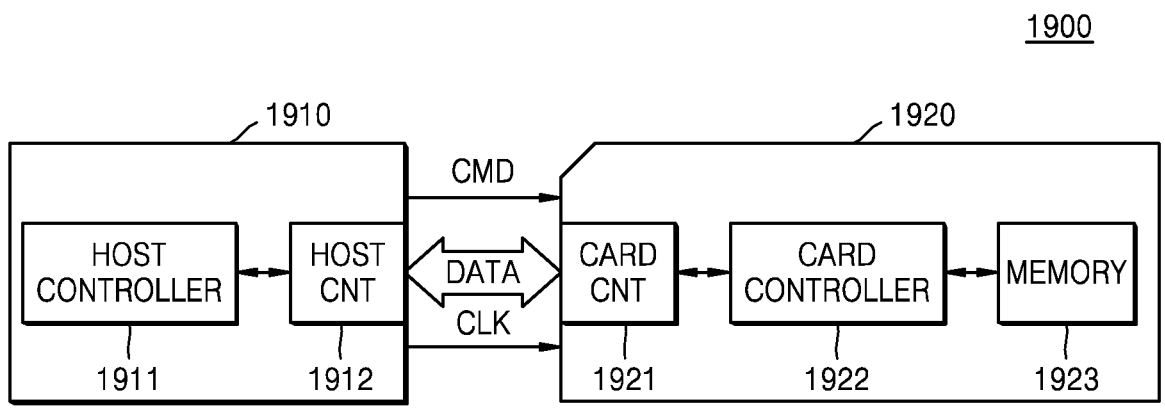
FIG. 19 is a block diagram illustrating an example where embodiments of a non-volatile memory device are applied to a memory card system.

FIG. 19 is a block diagram illustrating an example where embodiments of a non-volatile memory device 1900 are applied to a memory card system.

Referring to FIG. 19, memory card system 1900 may include a host 1910 and a memory card 1920. Host 1910 may include a host controller 1911 and a host connector 1912. Memory card 1920 may include a card connector 1921, a card controller 1922, and a memory device 1923.

Host 1910 may write data in memory card 1920, or may read the data stored in memory card 1920. Host controller 1911 may transmit a command CMD, a clock signal CLK, and data DATA to memory card 1920 through host connector 1912.

In response to the command CMD received through card connector 1921, card controller 1922 may store data in memory device 1923 in synchronization with a clock signal generated by a clock generator included in card controller 1922. Memory device 1923 may store data transmitted from host 1910. Memory device 1923 may include a plurality of mass SSDs, and the mass SSDs may include a plurality of non-volatile memory devices. The non-volatile memory devices may store initialization information in memory cells of a first memory block including single level cells among a plurality of memory blocks and may store user data in the other memory blocks. When power-up is detected in booting, the non-volatile memory devices may divide a source voltage to generate a low read pass voltage which is to be provided to unselected word lines in an initialization information read operation. The low read pass voltage may be set as at least one voltage between a ground voltage and the source voltage. The non-volatile memory devices may allow the source voltage not to be pumped in the initialization information read operation, based on the power-up. In the initialization information read operation, the non-volatile memory devices may select the first memory block, provide the low read pass voltage to unselected word lines, and provide a read voltage to a selected word line, thereby reading the initialization information stored in the memory cells of the first memory block. The non-volatile memory devices may set the read initialization information in a set register.

Memory card 1920 may be implemented with a compact flash card (CFC), a Microdrive, a smart media card (SMC), a multimedia card (MMC), a security digital card (SDC), a memory stick, a universal serial bus (USB) flash memory driver, and/or the like.

While the inventive concept has been particularly shown and described with reference to embodiments thereof, it will be understood that various changes in form and details may be made therein without departing from the spirit and scope of the following claims.

What is claimed is:

1. A non-volatile memory device comprising:
a memory cell array configured to store initialization information for the non-volatile memory device in memory cells connected to a plurality of word lines;
a voltage generator configured to receive a source voltage, generate a first read voltage from the source voltage, and generate a second read voltage from the source voltage, wherein the magnitude of the second read voltage exceeds the magnitude of the first read voltage and is less than or equal to the magnitude of the source voltage; and
a control circuit configured to control application of the first read voltage to a selected word line and to control application of the second read voltage to unselected word lines in an initialization information read operation of reading the initialization information, wherein:
the voltage generator generates the second read voltage in response to a voltage control signal provided by the control circuit in the initialization information read operation,
the voltage generator generates a third read voltage from the source voltage in a read operation of reading the non-initialization information, wherein the third read voltage has a magnitude exceeding that of the source voltage, and
the control circuit applies the first read voltage to another selected word line, among the word lines, and applies the third read voltage to other unselected word lines, among the word lines, to thereby read the non-initialization information from other memory cells of the memory cell array.

2. The non-volatile memory device of claim 1, wherein the memory cells are single level cells storing one-bit data.

3. The non-volatile memory device of claim 2, wherein the first read voltage is set to have a voltage level for discriminating between erase states and program states of the single level cells.

4. The non-volatile memory device of claim 3, wherein the first read voltage is set as a ground voltage.

5. The non-volatile memory device of claim 1, wherein the control circuit is configured to detect power-up to generate the voltage control signal.

6. The non-volatile memory device of claim 1, wherein the voltage generator comprises:
a voltage divider including a plurality of resistors serially connected between the source voltage and a ground voltage, the voltage divider being configured to generate division voltages at both ends of each of the plurality of resistors; and
a selector configured to output one of the division voltages as the second read voltage in response to the voltage control signal.

7. The non-volatile memory device of claim 1, further comprising a set register storing the initialization information read through the initialization information read operation.

8. The non-volatile memory device of claim 1, wherein the initialization information comprises protection information about inhibition or permission of program or erase operations performed on the memory cell array, trimming data for trimming an operating voltage level in a program, read, or erase operation mode of the non-volatile memory device, column repair information for repairing a failed bit line of the non-volatile memory device, or bad block information identifying bad memory cells of the non-volatile memory device.

9. A read method of a non-volatile memory device, the read method comprising:
an initialization information read operation; and
a read operation, wherein:
the initialization read operation includes:
detecting power-up;
in response to the detected power-up, reading initialization information for the non-volatile memory device stored in memory cells of the non-volatile memory device; and
when reading the initialization information:
generating a first read voltage that is provided to a selected word line of a plurality of word lines connected to the memory cells, and
generating a second read voltage that is provided to unselected word lines of the plurality of word lines connected to the memory cells, wherein the magnitude of the second read voltage exceeds the magnitude of the first read voltage and is less than or equal to the magnitude of a source voltage used to generate each of the first read voltage and the second read voltage, and
the read operation includes:
generating the first read voltage from the source voltage,
generating, from the source voltage, a third read voltage whose magnitude exceeds that of the source voltage,
applying the first read voltage to another selected word line, among the word lines, and
applying the third read voltage to other unselected word lines, among the word lines, to thereby read non-initialization information from other memory cells of the non-volatile memory device.

10. The read method of claim 9, wherein the generating of the second read voltage comprises dividing the source voltage, in response to a voltage control signal, to generate the second read voltage.

11. The read method of claim 9, wherein the memory cells are single level cells storing one-bit data.

12. The read method of claim 9, further comprising storing the read initialization information in a set register.

13. The read method of claim 9, wherein the initialization information comprises protection information about inhibition or permission of program or erase operations on the non-volatile memory device, trimming data for trimming an operating voltage level in a program, read, or erase operation mode for the non-volatile memory device, column repair information for repairing a failed bit line of the non-volatile memory device, or bad block information identifying bad memory cells of the non-volatile memory device.

14. A method comprising:
a non-volatile memory device detecting a power-up state for the non-volatile memory device;
in response to detecting the power-up state, the non-volatile memory device reading initialization information for the non-volatile memory device which is stored in first memory cells of a memory cell array of the non-volatile memory device and storing the initialization information for the non-volatile memory device in a set register of the non-volatile memory device; and the non-volatile memory device reading non-initialization information for the non-volatile memory device which is stored in second memory cells of the memory cell array, wherein:

reading the initialization information for the non-volatile memory device which is stored in the first memory cells of the memory cell array of the non-volatile memory device comprises:
- applying to selected word lines connected to the first memory cells a first read voltage having a first read voltage level for discriminating between erase states and program states of the first memory cells; and
- while applying the first read voltage to the selected word lines, applying to unselected word lines which are not connected to the first memory cells a second read voltage having a second read voltage level which is less than voltage levels of the program states of the first memory cells, the magnitude of the second read voltage exceeds the magnitude of the first read voltage and is less than or equal to the magnitude of a source voltage used to generate each of the first read voltage and the second read voltage, and reading the non-initialization information for the non-volatile memory device which is stored in the second memory cells of the memory cell array comprises:
- generating the first read voltage from the source voltage,
- generating, from the source voltage, a third read voltage whose magnitude exceeds that of the source voltage,
- applying the first read voltage to another selected word line, among the word lines, and
- applying the third read voltage to other unselected word lines, among the word lines, to thereby read the non-initialization information from other memory cells of the non-volatile memory device.

15. The method of claim 14, further comprising the non-volatile memory device:
- receiving the source voltage which is less than the voltage levels of the program states of the first memory cells; and
- applying the source voltage to a low voltage generation circuit to generate the second read voltage which is less than voltage levels of the program states of the first memory cells.

16. The method of claim 15, wherein the second read voltage level is between a ground voltage level and a level of the source voltage.

17. The method of claim 14, wherein the second read voltage level is a ground voltage level.

18. The method of claim 14, wherein the initialization information comprises protection information about inhibition or permission of program or erase operations on the non-volatile memory device, trimming data for trimming an operating voltage level in a program, read, or erase operation mode for the non-volatile memory device, column repair information for repairing a failed bit line of the non-volatile memory device, or bad block information identifying bad memory cells of the non-volatile memory device.

* * * * *